United States Patent [19]

Nishimura et al.

[11] Patent Number: 5,436,301
[45] Date of Patent: Jul. 25, 1995

[54] EPOXY RESIN-IMPREGNATED PREPREG

[75] Inventors: Kunio Nishimura, Ibaraki; Tadashi Hirakawa, Suita, both of Japan

[73] Assignee: Teijin Limited, Osaka, Japan

[21] Appl. No.: 490

[22] Filed: Jan. 5, 1993

Related U.S. Application Data

[63] Continuation-in-part of Ser. No. 865,692, Apr. 8, 1992, abandoned, which is a continuation of Ser. No. 439,024, Nov. 3, 1989, abandoned.

[30] Foreign Application Priority Data

May 9, 1988 [JP] Japan ................. 63-110382
May 9, 1988 [JP] Japan ................. 63-110383

[51] Int. Cl.⁶ .............. C08L 63/02; C08L 63/04; C08L 77/06; C08L 77/10
[52] U.S. Cl. ...................... 525/423; 525/523
[58] Field of Search ............... 525/423, 523

[56] References Cited

U.S. PATENT DOCUMENTS 4,532,275  7/1985  Aito et al. ................. 525/423

Primary Examiner—W. Robinson Clark
Attorney, Agent, or Firm—Burgess, Ryan & Wayne

[57] ABSTRACT

An epoxy resin-impregnated prepreg useful for the production of a copper foil-laminated board of a chip-on-board having a high heat resistance, high dimension stability and high silver migration-preventing property, comprises an aromatic polyamide fiber base material having 3.0% by weight or less of an equilibrium moisture content, 80 ppm or less of an extracted chlorine content and 50 ppm or less of an extracted sodium content, and an epoxy resin composition comprising an epoxy resin and a curing agent, containing 5 ppm or less of sodium and 600 ppm or less of chlorine and impregnated in the base material, said aromatic polyamide fibers having been produced by a wet spin-drawing process having a draw-washing procedure in which undrawn aromatic polyamide filaments are drawn at a draw ratio of 1.05 to 1.5, while forwarding the filaments through a hot water bath having a path length of 1 to 50 m and while flowing hot water at 30° C. to 100° C. through the bath in a counter direction against the forwarding direction of the filaments to effectively squeeze out impurities from the filaments.

20 Claims, 8 Drawing Sheets

EPOXY RESIN-IMPREGNATED PREPREG

This application is a continuation-in-part of our application Ser. No. 07/865,692 filed on Apr. 8, 1992, which is a continuation of our application Ser. No. 07/439,024, filed on Nov. 3, 1989, both now abandoned.

TECHNICAL FIELD

The present invention relates to an epoxy resin-impregnated prepreg. More particularly, the present invention relates to an epoxy resin composition-impregnated prepreg which is valuable for the production of a copper clad laminate board for a printed wiring board (PWB) and has an excellent heat resistance and dimension stability and which can provide a PWB in which the migration of silver is precisely controlled and the reduction of the insulation resistance is very small even in an electric field under high-temperature and high-humidity conditions.

BACKGROUND ART

Recently, a copper clad laminate comprising an aromatic polyamide fiber having an excellent heat resistance and dimension stability as the base material has been developed and has been used as a substrate for various circuit boards for which a high heat resistance and dimensional stability are required. This copper clad laminate is prepared by laminating a copper foil and at least one prepreg formed by impregnating a woven fabric, paper-like sheet or nonwoven fabric composed of aromatic polyamide fibers, with a varnish composition comprising an epoxy resin or the like.

For example, Japanese Unexamined Patent Publication No. 61-100446 discloses a flexible printed circuit board characterized in that an electrically insulating material formed by impregnating a nonwoven fabric composed mainly of aromatic polyamide fibers with a resin composition comprising an epoxy resin and a rubbery resin is used as a base material and/or cover layer. Furthermore, Japanese Unexamined Patent Publication No. 62-283695 discloses a flexible circuit board characterized by comprising a flexible base plate formed by impregnating an aramid fiber fabric base material having a thickness of 0.025 to 0.5 mm with an adduct of an aromatic amine curing agent to an epoxy resin and a metal foil circuit layer formed on one or two surfaces of the flexible base plate.

Often, however, it was found that when silver electrodes are formed on a substrate as mentioned above and an electric field is applied between these silver electrodes, after a lapse of a predetermined time, a migration of silver into the substrate occurs, especially under high-temperature and high-humidity conditions, resulting in a reduction of the insulation resistance of the substrate. It is considered that this phenomenon of the migration of silver is due to the synergistic action of the aromatic polyamide fiber, which is a material having a high hygroscopic property and containing large quantities of sodium and chloride, and the epoxy resin which is a matrix containing large quantities of sodium and chlorine. A reduction of the insulation resistance between electrodes is a fatal defect in a high-density wiring board such as a COB, and accordingly, the development of a prepreg for a copper clad laminate, in which the reduction of the insulation resistance does not occur, is needed.

Furthermore, a higher heat resistance is required for the substrate, to improve the dimension stability in a wiring board product, and since the wiring circuit width is reduced, the heat resistance should be improved without a reduction of the peel strength. Therefore, the development of a prepreg for a copper clad laminate, which has an excellent property of preventing the migration of silver even in an electric field under high-temperature and high-humidity conditions, and a high heat resistance and peel strength, is urgently required.

DISCLOSURE OF THE INVENTION

An object of the present invention is to provide an epoxy resin composition-impregnated prepreg which is useful for a copper clad laminate for a chip-on-board (COB) technology and is suitable for a formation of a chip-on-board in which the reduction of the insulation resistance is very small even in an electric field under high-temperature and high-humidity conditions and which has an excellent heat resistance and peel strength.

The epoxy resin composition-impregnated prepreg of the present invention for a copper clad laminate of a chip-on-board comprises
a base material comprising, as a main component, aromatic polyamide fibers; and
a resin composition comprising an epoxy resin and a curing agent impregnated in the base material,
said aromatic polyamide fibers having been produced by a wet-spin-drawing process having a draw-washing procedure in which undrawn aromatic polyamide filaments are drawn at a draw ratio of from 1.05 to 1.50, while forwarding the filaments through a hot water bath having a path length of 1 to 50 m and while flowing the hot water at a temperature of 30° C. to 100° C. through the bath in a direction counter to the forwarding direction of the filaments to squeeze out impurities from the filaments, and the draw-washed filaments are dried;
said aromatic polyamide fiber base material having an equilibrium moisture content of up to 3.0% by weight, an extracted impurity sodium content of up to 80 ppm and an extracted impurity chlorine content of up to 50 ppm, and said epoxy resin composition having an impurity sodium content of up to 5 ppm and an impurity chlorine content of up to 600 ppm.

In the epoxy resin composition-impregnated prepreg of the present invention, the epoxy resin in the epoxy resin composition preferably comprises a reaction product of (I) at least one member selected from the group consisting of a glycidyl ether compounds consisting of reaction products of epichlorohydrin with polycondensation products of bisphenol A and formaldehyde, and a halogenated glycidyl ether compounds consisting of reaction products of epichlorohydrin with polycondensation products of halogenated bisphenol A with formaldehyde, with (II) at least one member selected from bisphenol A and bisphenol F type glycidyl ether compounds represented by the following formula:

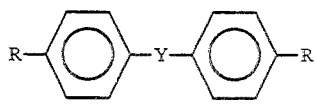

wherein Y represents a member selected from a —C(CH$_3$)$_2$— group and —CH$_2$— group, R represents an oligomeric residue of an epoxy compound, and each benzene nucleus may be substituted with a bromine atom, and (III) at least one member selected from bisphenol A, bisphenol F and tetrabromobisphenol A.

Also, the curing agent in the epoxy resin composition preferably comprises at least one member selected from the group consisting of (A) polycondensation products of bisphenol A and formaldehyde and (B) polycondensation products of halogenated bisphenol A and formaldehyde.

Further, in the epoxy resin composition, preferably the ratio of the phenolic hydroxyl group equivalent of the curing agent to the epoxy equivalent of the epoxy resin is in the range of from 0.6 to 1.3.

BEST MODE OF CARRYING OUT THE INVENTION

Figure 1:
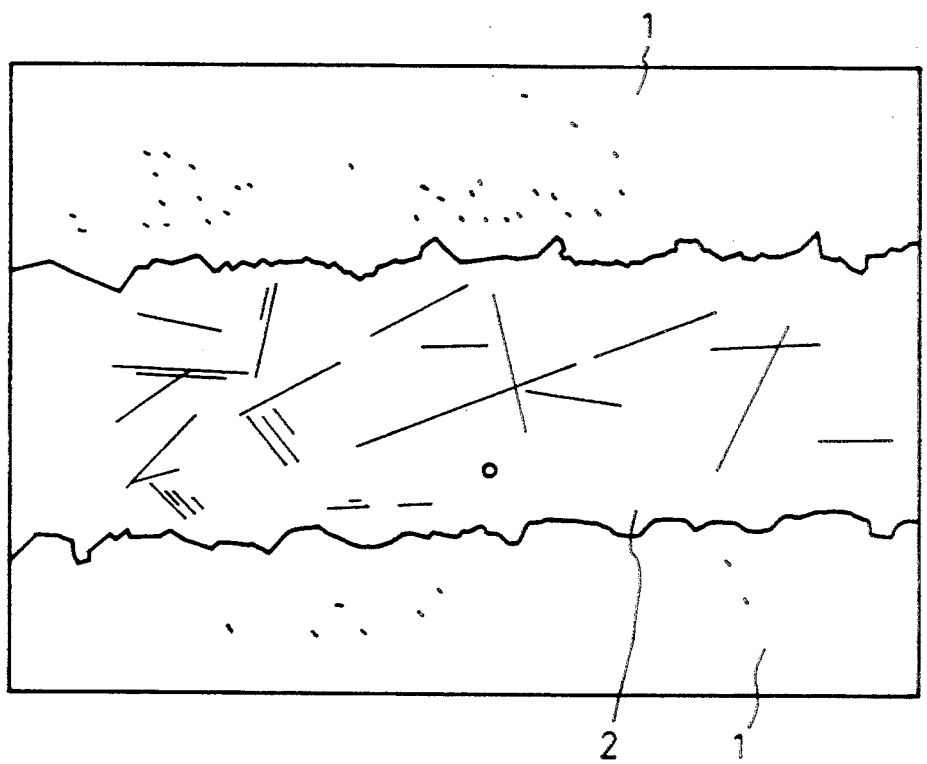
FIG. 1 is a diagram illustrating the migration of silver on the surface of PWB prepared by using the prepreg of the present invention.

The epoxy-impregnated prepreg of the present invention comprises a base material comprising, as a main component, aromatic polyamide fibers and an epoxy resin composition with which the base material is impregnated.

Preferably, in the prepreg of the present invention, the weight ratio of the aromatic polyamide fiber base material to the epoxy resin composition is from 20/80 to 60/40, preferably from 30/70 to 55/45, more preferably from 35/65 to 50/50. If this weight ratio is outside the above-mentioned range, the obtained prepreg has an unsatisfactory dimensional stability, thermal expansibility, and insulating property, and the heat resistance of the prepreg is not satisfactory for the soldering of the resultant copper foil-laminated board.

The polymer constituting the aromatic polyamide fiber used in the present invention preferably comprises 75 to 100 molar % of at least one member selected from recurring units represented by the following formulae (I) and (II):

$$\text{+N—Ar}_1\text{—N—C—Ar}_2\text{—C+} \quad \text{(I)}$$

and $$\text{+N—Ar}_3\text{—C+} \quad \text{(II)}$$

In the above formulae (I) and (II), Ar$_1$, Ar$_2$ and Ar$_3$ represent, respectively and independently from each other, a member selected from substituted and unsubstituted aromatic ring groups represented by the following formulae:

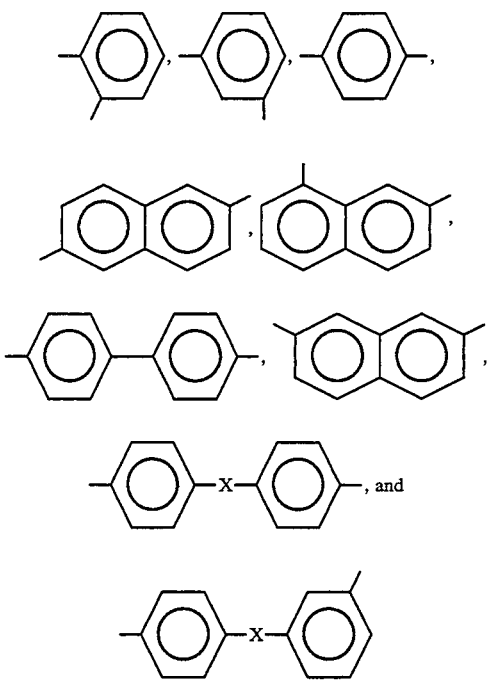

wherein X represents a member selected from —O—, $$-S-, -\overset{O}{\underset{\|}{C}}-, -CH_2- \text{ and } -\overset{CH_3}{\underset{CH_3}{\overset{|}{C}}}-.$$

In the aromatic polyamide comprising the recurring units of above formula (I), preferably 15 to 30% of the aromatic ring groups represented by Ar$_1$ are

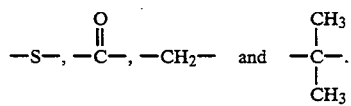

and the remaining aromatic ring groups are

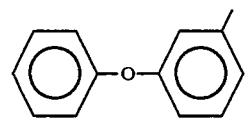 groups.

In this case, in these linear aromatic ring groups or parallel bonded aromatic ring groups portions of hydrogen atoms bonded directly to the aromatic ring groups may be substituted with at least one member selected from a halogen atom, a methyl group and a methoxy group.

Preferably, the aromatic polyamide fibers used in the present invention are high-modulus wholly aromatic polyamide fibers produced, for example, by shaping a wholly aromatic polyamide as mentioned above into fibers by a conventional method, and drawing the fibers sufficiently to impart a high molecular orientation to the fibers.

The aromatic polyamide fibers may be in the form of any of short fibers, pulpy fibrils and a mixture thereof. The pulpy fibril can be formed by grind-pulverizing the fibers.

The present inventors investigated the causes of the migration of silver, which is a defect of the substrate for the PWB comprising as a base material an aromatic polyamide fibers, and as a result, found that if only the purity of the epoxy resin composition constituting the matrix in the substrate is increased, the migration of silver cannot be prevented, and that to prevent the migration of silver, the equilibrium moisture content, sodium content and chlorine content of the aromatic polyamide fibers used as the base material must be reduced below certain levels, and the sodium and chlorine contents of the epoxy resin composition containing the curing agent must be reduced below certain levels. Namely, the present invention was completed based on the finding that, by the synergistic action of these features the migration of silver can be greatly reduced.

In short, the aromatic polyamide fibers used in the present invention are fibers in which the equilibrium moisture content, residual sodium content, and residual chlorine content are much lower than those of the conventional aromatic polyamide fibers.

In general, the aromatic polyamide fibers are obtained by wet-spinning a solution of a polymer obtained by polymerization reaction of an aromatic diamine with an aromatic dicarboxylic acid chloride, water-washing and drying the obtained undrawn filaments, draw-washing, the undrawn filaments, and drying the drawn filaments.

In the draw-washing procedure, the undrawn filaments are drawn at a draw ratio of from 1.05 to 1.50, preferably 1.1 to 1.4, while forwarding the filaments through a washing hot water bath having a path length of 1 to 50 m, preferably 2 to 20 m, and while flowing hot water at a temperature of 30° C. to 100° C., preferably 50° C. to 100° C. through the bath in a direction counter to the forwarding direction of the filaments to squeeze out impurites from the filaments, and then drying the draw-washed filaments.

The resultant filaments are optionally drawn at a draw ratio of 1.5 to 8.0 and/or heat treated at a temperature of 200° C. to 600° C. for 1 to 100 seconds.

The equilibrium moisture content of the aromatic polyamide fiber can be reduced to a desired level by imparting an optimum structure to the fibers obtained by controlling the composition and physical properties of the polymer, the drawing conditions at the heat-drawing step, and the heat treatment conditions.

Where the aromatic polyamide fibers are fibers obtained by isolating the polymer from the polymerization solution, dissolving the polymer in an inorganic acid such as concentrated sulfuric acid and wet-spinning the obtained solution, the inorganic acid must be sufficiently removed, but this cannot be attained by only a simple water washing, and a neutralization with an aqueous solution of sodium hydroxide and a water washing are necessary. Nevertheless, this neutralization treatment results in a defect in that a large quantity of an inorganic salt of sodium remains in the fibers. Accordingly, preferably the aromatic polyamide fibers used in the present invention are fibers obtained by directly wet-spinning a polymerization solution obtained by carrying out the polymerization in a non-protonic amide solvent without isolation of the formed polymer. In this case, since an inorganic acid such as concentrated sulfuric acid is not used, the neutralization treatment with sodium hydroxide need not be carried out, and therefore, the amount of sodium remained in the fibers can be greatly reduced. In the production of the aromatic polyamide fibers used in the present invention, to reduce the amount of sodium remained in the fibers, preferably starting materials having a high purity are used and the sodium content in the solvent, coagulating solution, and oiling agent is reduced as much as possible. The main source of chlorine remained in the aromatic polyamide fibers is hydrogen chloride formed as a by-product at the polymerization step. Residual chlorine can be removed by neutralizing hydrogen chloride in the polymerization system with calcium hydroxide or the like and washing the obtained fibers with water. Preferably, the aromatic polyamide fibers used in the present invention are fibers obtained by using starting materials having a high purity, controlling the chlorine content in the solvent, coagulating solution and oiling agent to as low a level as possible, maintaining the neutralization degree of the polymerization solution within an optimum range, using a sufficiently filtered spinning solution, and supplying the stream of the extruded spinning solution into a coagulating solution maintained at an appropriate pH value to effect removal of the solvent and a formation of fibers. According to this process, the amount of chlorine remaining in the fibers can be greatly reduced.

In the aromatic polyamide fiber base material of the present invention, the equilibrium moisture content is 3.0% by weight or less, preferably 2.0% by weight or less, and the extracted sodium content is 80 ppm or less, preferably 70 ppm or less. The extracted chlorine content is 50 ppm or less, preferably 40 ppm or less.

The equilibrium moisture content is the value of the water content in the fiber as measured in the equilibrium state at a temperature of 20° C. and a relative humidity of 65% according to the chemical filament yarn test method of JIS L-1013. At the measurement, to eliminate the influences of the oiling agent and other substances adhering to the surface of the fibers, the fibers are pre-washed with cyclohexane at 50° C. for 30 minutes.

The extracted sodium content is the value obtained by dividing the absolute value of the sodium content of the filtrate obtained after boiling about 10 g of the aromatic polyamide fibers immersed in 100 g of pure water for 20 hours, determined by the quantitative analysis according to the atomic absorption spectroscopy, by the weight of the aromatic polyamide fibers before the extraction.

The extracted chlorine content is the value obtained by dividing the absolute value of the chlorine content of the filtrate obtained after boiling about 10 g of the aromatic polyamide fibers immersed in 100 g of pure water for 20 hours, determined by the quantitative analysis according to the ion chromatography, by the weight of the aromatic polyamide fiber before the extraction.

If the equilibrium moisture content of the aromatic polyamide fiber base material used in the present invention is higher than 3.0% by weight, when the obtained PWB is placed in an electric field under high-temperature and high-humidity conditions, sodium or chlorine in the substrate is ionized, and therefore, the silver electrode formed on the surface of the substrate is ionized and a hydrate is readily formed, with the result that silver oxide is deposited on the positive electrode and silver is deposited on the negative electrode, and thus a migration of the silver occurs.

If the extracted sodium content in the aromatic polyamide fiber base material is higher than 80 ppm, when the obtained PWB is placed in an electric field under high-temperature and high-humidity conditions, residual sodium is converted to a sodium ion to promote the ionization of the base plate, and thus the migration of silver occurs.

If the extracted chlorine content of the aromatic polyamide is higher than 20 ppm, when the obtained PWB is placed in an electric field under high-temperature and high-humidity conditions, residual chlorine is converted to a chlorine ion to increase the amount of ionized chlorine in the base plate. The increase in the amount of chlorine accelerates the ionization of residual sodium, and simultaneously, promotes the ionization of water. A portion of the chlorine ions reacts with the silver ions to form silver chloride, and therefore, the ionization of silver is promoted. As the result, silver chloride is converted to silver hydroxide, and further to silver oxide, and this silver oxide is deposited in the vicinity of the positive electrode. Accordingly, the silver migration occurs and an insufficient insulation is provided.

Namely, in the epoxy resin-impregnated base plate comprising the aromatic polyamide fiber base material, the amounts of residual water, sodium and chlorine participate closely in the migration of silver, and only when the equilibrium moisture content, extracted sodium content and extracted chlorine content as the quantitative values of these factors are lower than above-mentioned upper limit values and the sodium and chlorine contents in the epoxy resin composition are lower than the upper limit values described below, as explained in detail hereinafter, will a PWB placed in an electric field under high-temperature and high-humidity conditions exhibit an excellent property of preventing the migration of silver. If any of the contents of the foregoing elements exceeds the upper limit value, the prevention of the migration of silver is unsatisfactory.

The individual filament thickness of the aromatic polyamide fibers usable for the present invention is preferably from 0.1 to 10 denier. The aromatic polyamide fibers may be in the form of a woven fabric, a knitted fabric, a nonwoven fabric or a paper-like sheet preferably a paper-like sheet. Alternatively, the aromatic polyamide fibers may be dispersed in the epoxy resin composition.

The aromatic polyamide fiber base material usable for the present invention can comprise 60 to 100% by weight, preferably 70 to 100% by weight, of the aromatic polyamide fibers and 0 to 40% by weight, preferably 0 to 30% by weight, of at least one other type of fibers. The other fibers can be contained in the base material, so long as a realization of the intended object or functional effect of the present invention is not hindered. For example, the other fibers can be selected from glass fibers, carbon fibers, polyether ketone fibers, polyether ether ketone fibers, polyester imide fibers, polyimide fibers, wholly aromatic polyester fibers, polyphenylene sulfide fibers and ceramic fibers.

The epoxy resin composition usable for the present invention comprises an epoxy resin and a curing agent. The epoxy resin may further comprise at least one member selected from a curing promoter, a lubricant, a flame retardant, a stabilizer, a release agent, an inorganic or organic filler, fine particles of a fluorine-containing polymer, a pigment, a dye, and a calcium carbide.

The epoxy resin composition used in the present invention comprises an epoxy resin and a curing agent, and preferably the content of the curing agent is 2 to 60% by weight, more preferably 10 to 40% by weight, based on the weight of the epoxy resin.

The epoxy resin composition usable for the present invention has a sodium content of 5 ppm or less preferably 3 ppm or less, and a chlorine content of 600 ppm or less, preferably 400 ppm or less. The sodium and chlorine contents include not only sodium and chlorine inherently contained in the epoxy resin, curing agent and additive, but also those contained in the solvent and the like used in the production thereof.

The sodium content is the value obtained by dividing the absolute value of the amount of sodium in the liquid formed by ashing about 2 g as the solid of the uncured epoxy resin composition (usually a varnish) in a crucible, dissolving under heating the ashed product in 10 ml of a 30% aqueous solution of nitric acid and adding pure water to the solution so that the total volume is 50 ml, determined by quantitative analysis according to the atomic adsorption spectroscopy, by the weight before ashing.

The chlorine content is the value obtained by dividing the amount of chlorine in the solution formed by diluting and dissolving about 25 g as the solid of the epoxy resin composition in methylethylketone and adjusting the concentration of the solution to 50%, determined by the quantitative analysis according to the X-ray fluorometry, by the weight of the solid of the composition.

In the present invention, if the sodium content in the epoxy resin composition is higher than 5 ppm, or if the chlorine content is higher than 600 ppm, when obtained PWB is placed in an electric field under high-temperature and high-humidity conditions, regardless of the kind of the aromatic polyamide fibers used as the base material, the amount of sodium or chlorine ionized in the substrate becomes too large and ionization of the water in the base plate is promoted, whereby the formation of the silver ions is accelerated, with the result that silver is deposited in the vicinity of the positive electrode and the migration of silver occurs to provide an insufficient insulation in the substrate. In this case, if the equilibrium moisture content is higher than 3.0% by weight, the extracted sodium content is higher than 80 ppm, or the extracted chlorine content is higher than 50 ppm in the aromatic polyamide fiber base material, the migration of silver in PWB is further promoted.

The kind of the epoxy resin is not particularly critical in the present invention, but the following epoxy resins are generally used.

(A) Diglycidyl ether compounds consisting of reaction products of at least one member selected from bisphenol A and halogenated bisphenol A with epichlorohydrin (for example, Epikote 828, Epikote 1001, Epikote 1002, Epikote 1003, Epikote 1004, Epikote 1005, Epikote 5045, Epikote 5046, Epikote 5048 and Epikote 5049 supplied by Yuka-Shell Epoxy).

(B) Polyglycidylether compounds consisting of reaction products of polyhydric alcohol compounds consisting of reaction products of bisphenol A with an alkylene oxide in the presence of an acid or alkali catalyst, with epichlorohydrin (for example, EP-4000 supplied by Asahi-Denka).

(C) Phenol-novolak epoxy compounds (for example, Epikote 152 and Epikote 154 supplied by Yuka-Shell Epoxy).

(D) o-cresol-novolak epoxy compounds (for example, Epikote 180S65 supplied by Yuka-Shell Epoxy).

At least one member selected from the foregoing epoxy resins is used.

The curing agent contained in the epoxy resin composition is not particularly critical, but in general, at least one member selected from dicyandiamide compounds, aromatic polyamines and phenolic resins can be used. The aromatic polyamine is suitable for obtaining a cured epoxy resin product having a high heat resistance.

A curing promoter can be further incorporated in the epoxy resin composition usable for the present invention. Imidazoles, imidazolines and tertiary phosphines such as triphenylphosphine are preferably used.

Hitherto, as flame-retardant epoxy resin compositions usable for the prepregs for copper clad laminates, a mixture of a brominated bisphenol A epoxy resin which is a copolymerization product of tetrabromobisphenol A and bisphenol A with epichlorohydrin, with a heat-resistant o-cresol-novolak type epoxy resin and dicyandiamide as the curing agent has been frequently used. This epoxy resin, however, has a poor heat resistance, and since dicyandiamide contained as the curing agent in the epoxy resin has a low solubility in a solvent and is readily crystallized, the curing reaction is not uniformly advanced in the epoxy resin composition and a low-molecular-weight component tends to remain therein.

Therefore, even if the sodium or chlorine content can be controlled to a very low level in the aromatic polyamide fiber base material and the epoxy resin composition, when the resultant PWB is placed in an electric field under high-temperature and high-humidity conditions, the migration of silver often occurs. If an aromatic amine or an acid hydride is used as the curing agent instead of dicyandiamide, the resultant cured product of the epoxy resin composition has an enhanced heat resistance, but even if the sodium or chlorine content can be controlled to a very low level, the resultant PWB is defective in that the migration of silver often occurs. Currently, novolak resins having good heat resistance and moisture resistance, such as a phenol-novolak resin, an o-cresol-novolak resin, an m-cresol-novolak resin, a cresol-novolak resin and a resorcinol-novolak resin, are used as the curing agent for semiconductor-sealing epoxy resins. Where these novolak resins are used, the migration of silver in PWB can be prevented to a certain extent, but the copper foil-laminated board is defective in that the peel strength is drastically reduced. On the other hand, if a highly adhesive epoxy resin is added to improve the peel strength, the heat resistance is degraded in the resultant copper foil-laminated board.

Therefore, the development of a combination of an epoxy resin and a curing agent, quite different from the conventional combinations is urgently needed for obtaining a copper clad laminate having a property of preventing the migration of silver and an excellent heat resistance and peel strength.

The following epoxy resins and curing agents are preferably used for obtaining epoxy resin compositions satisfying these requirements.

The epoxy resin preferable for the present invention (hereinafter referred to as "epoxy resin c") comprises at least one member of the reaction products of (I) at least one member selected from the group consisting of a glycidyl ether compounds consisting of reaction products of epichlorohydrin with polycondensation products of bisphenol A with formaldehyde, and a halogenated glycidyl ether compounds consisting of reaction products of epichlorohydrin with polycondensation products of halogenated bisphenol A with formaldehyde, with (II) at least one member selected from bisphenol A- and bisphenol F-type glycidyl ether compounds represented by the following formula:

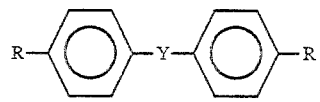

wherein Y represents a member selected from a —C(CH$_3$)$_2$— and —CH$_2$— group, R represents an oligomeric residue of an epoxy compound, and each benzene nucleus may be substituted with a bromine atom, and (III) at least one member selected from bisphenol A bisphenol F and tetrabromobisphenol A.

The curing agent preferable for the present invention (hereinafter referred to as "curing agent d") comprises at least one member selected from poly condensation products of bisphenol A with formaldehyde, and a polycondensation products of halogenated bisphenol A with formaldehyde. Preferably, the ratio of the phenolic hydroxyl group equivalent of the curing agent to the epoxy equivalent of the epoxy resin is from 0.6 to 1.3, especially from 0.7 to 1.2.

Among the epoxy resins c, an epoxy resin comprising a reaction product of (i) 50 to 90 parts by weight of at least one type of glycidyl ether compound component consisting of a reaction product of epichlorohydrin with a polycondensation product of at least one member selected from bisphenol and brominated bisphenol with formaldehyde, with (ii) 5 to 50 parts by weight of at least one bisphenol type epoxy resin component and (iii) 10 to 50 parts by weight of tetrabromobisphenol A component is especially preferable.

The reaction product of the above-mentioned components (i), (ii) and (iii) can be prepared in the presence of, for example, a catalyst comprising an imidazole compound (such as dimethylimidazole) or an imidazoline.

If the above-mentioned epoxy resin c and curing agent d are used for the prepreg of the present invention, in a PWB obtained by using a copper foil-laminated board comprising this prepreg, the silver migration-preventing property, the heat resistance and the peel strength can be improved while maintaining a good balance among these properties. It is construed that, since the skeleton of the molecular structure of the compound constituting the curing agent d resembles the skeleton of the compound constituting the epoxy resin, the compatibility of the two components with each other is good, and by the curing reaction therebetween, a well-balanced crosslinked structure is formed.

The ratio of the phenolic hydroxyl group equivalent of the curing agent d to the epoxy equivalent of the epoxy resin c is from 0.6 to 1.3, preferably 0.7 to 1.2. If this equivalent ratio exceeds 1.3, a portion of the curing agent d remains in the unreacted state, and if the equivalent ratio is lower than 0.6, a portion of the epoxy resin c remains in the unreacted state. In each case, the performances of the resultant prepreg are degraded.

When a higher flame retardance is required for the epoxy resin composition of the present invention, a brominated bisphenol A epoxy resin can be added in an amount of 10 to 30% by weight based on the total solids of the epoxy resin composition. Preferably, the bromine content in this brominated bisphenol A epoxy resin is 45 to 55% by weight.

The epoxy resin composition may further contain a curing promoter. Imidazole compounds and imidazoline compounds are preferably used as the curing promoter. For example, there are preferably used imidazole compounds such as 2-methylimidazole, 2-ethylimidazole, 4-methylimidazole, 2-ethyl-4-methylimidazole, 2-undecylimidazole and 1-benzyl-2-methylimidazole, and imidazoline compounds such as 2-ethyl-4-methylimidazoline, 2-undecylimidazoline and 2-methylimidazoline.

Triphenylphosphine can be used as another curing promoter.

The epoxy resin composition may further comprise, for example, a lubricant, an adhesion promoter, a flame retardant, a stabilizer (such as an antioxidant, an ultraviolet absorber or a polymerization inhibitor), a release agent, a plating activator, an inorganic or organic filler (silica, talc, titanium oxide, a fine particle of a fluorine copolymer, a pigment, a dye or calcium carbide) or the like, so far as the performances of the cured product are not degraded. Use of antimony trioxide as the flame retardant is especially preferred. Antimony pentoxide is most preferred because antimony pentoxide has an excellent dispersibility in a varnish and the stability and does not cause contamination in an electroless plating by dissolution. Preferably, the antimony oxide is incorporated in an amount of 0.2 to 10% by weight based on the total solids of the epoxy resin composition.

Where the curing agent d is contained in the epoxy resin composition of the present invention, an aromatic polyamine may be further added. As the aromatic polyamine, there can be used diaminodiphenyl ether, diaminodiphenylmethane, diaminodiphenylsulfone, 4,4'-methylene-dianiline, diaminodinitrile-sulfone, bis(3,4-diaminophenyl)sulfone, m-aminobenzylamine, 4-methoxy-6-methyl-m-phenylenediamine and 4,4'-thiodianiline. A halogenated aromatic polyamine also can be used.

The epoxy resin composition of the present invention can be dissolved in various solvents. For example, at least one member selected from acetone, methylethylketone, toluene, xylene, methylisobuthylketone, ethyl acetate, ethylene glycol monomethyl ether, N,N'-dimethylformamide, N,N-dimethylacetamide, methanol and ethanol can be used.

The prepreg of the present invention can be prepared by impregnating the aromatic polyamide fiber base material with the epoxy resin composition and drying the aromatic polyamide fiber, if necessary, by customary procedures.

The copper clad laminate of the present invention can be prepared by piling a predetermined number of prepregs, piling a copper foil on the prepreg or prepreg laminate, and integrally curing and molding the laminate by heating under compression.

EXAMPLES

The present invention will now be described in detail with reference to the following examples. The following measurement methods were adopted in the examples.

<Insulation Resistance between Silver Electrodes>

Electrodes of a copper foil were formed with a distance of 0.5 mm therebetween on an etched substrate by using a silver paste (No. 4929 supplied by Du Pont) according to the screen printing method. Air conditioning was effected at a temperature of 20° C. and a relative humidity of 65% for 96 hours, and immediately, a direct current voltage of 500V was applied and the insulation resistance was measured. Then, the solder reflowing was carried out at 220° C. for 2 minutes, and the pressure cooker test was carried out at 121° C. under 2 $kg/cm^2$ while applying a direct current voltage of 90V between the electrodes. The substrate was conditioned at a temperature of 20° C. and a relative humidity of 65% for 96 hours, and immediately, the insulation resistance was measured by applying a direct current voltage of 500 V.

<Degree of Migration of Silver>

Just after the above-mentioned pressure cooker test, the surface between the electrodes was observed by an optical microscope and the degree of migration of the silver was evaluated.

<Glass Transition Point Tg>

A thermal analysis apparatus (TMA supplied by Rigaku Denki) was used. A sample (completely etched product) having a width of 4.5 mm and length of 23 mm was cut out at a temperature of 20° C. and a relative humidity of 40% and set on TMA while adjusting the distance between chucks to 20 mm. At the pulling mode, the temperature was elevated to 200° C. at a rate of 10° C./min under a load of 5 g, and the temperature was dropped to 50° C. at a rate of 5° C./min and was then elevated to 200° C. again at a rate of 10° C./min. The point at which the differential coefficient was zero in the second temperature elevation curve was designated as the glass transition point Tg (° C).

<Peel Strength PS>

The peel strength of a 1-oz copper foil at normal temperature was measured according to the method of JIS C-6481.

Referential Example 1 (Preparation of aromatic polyamide filbers usable for the present invention)

A wholly aromatic polyether-amide was prepared by dissolving 10.72 parts of 3,4'-diaminodiphenyl ether and 5.79 parts of p-phenylenediamine in 500 parts of N-methyl-pyrrolidone in a stream of dry nitrogen, cooling the solution to 0° C., and with nigorous stirring, quickly adding 21.74 parts of terephthaloyl chloride powder to the cooled solution to polymerize the monomers, and after the lapse of about 5 hours, adding calcium oxide to the reaction mixture to neutralize the by-product hydrochloric acid.

The resultant copolymer solution was filtered, defoamed and wet spun under such conditions that the copolymer solution was extruded through a spinneret having 1,000 orifices, and the extruded filamentary streams of the copolymer solution were solidified in a coagulating both under a draft ratio of 2.

The resultant undrawn filaments were drawn at a draw ratio of 1.2, while forwarding the filaments through a hot water bath having a path length of 10 m and while flowing hot water at a temperature of 50° C.

through the bath in a direction counter to the forwarding direction of the filaments. Then, the filaments were further drawn at a draw ratio of 6.0 at a temperature of 450° C., to provide drawn individual filaments each having a denier of 1.5.

The resultant drawn filaments had an equilibrium moisture content, extracted sodium content and extracted chlorine content as shown in Table 1.

Referential Example 2 (Preparation of comparative aromatic polyamide fibers).

Comparative Experiment I (REFERENTIAL EXAMPLE 1 of Aito)

The same procedures as in Referential Example 1 were carried out with the following exceptions.

The resultant undrawn filaments were washed with water in the same washing bath having a path length 10 m, at room temperature and at a velocity of 550 m/min without flowing water through the bath.

The washed filaments were hot-drawn on a heat-drawing roller at a temperature of 500° C. at a draw ratio of 5.3.

The test results are shown in Table 1.

TABLE 1

|  | Referential Example No. | |
| --- | --- | --- |
|  | 1 | 2 |
| Item | (The present invention) | (Comparative) |
| Moisture content (%) | 1.8 | 4.2 |
| Sodium content (ppm) | 52 | 102 |
| Chlorine content (ppm) | 30 | 86 |

Table 1 clearly shows that the copolyamide filaments of Referential Example 2 had high moisture, sodium and chlorine contents, compared with those usable for present invention.

Examples 1 to 6 and Comparative Examples 1 to 7

In each of Examples 1 through 6 and Comparative Examples 3 through 7, a wholly aromatic polyether-amide (polyphenylene-3,4'-diaminodiphenylether terephthalamide) was prepared by copolymerizing 100 molar parts of terephthalic acid chloride having a predetermined purity, 50 molar parts of p-phenylene-diamine and 50 molar parts of 3,4-diaminodiphenylether, and the copolymer was wet-spun and draw-washed in the same manner as in the Referential Example, to provide drawn fibers having equilibrium moisture content, extracted sodium content and extracted chlorine content shown in Table 2, and a single filament fineness of 1.5 denier. A woven fabric prepared from this fiber was used as the base material. In Comparative Examples 1 and 2, a woven fabric composed of poly-p-phenylene terephthalamide (Kevlar 49 $^R$ woven fabric, single filament fineness=1.42 denier) was used as the base material. Each of these base materials had a base weight of 60 g/m² and a thickness of about 0.1 mm.

Separately, the above-mentioned wholly aromatic polyether-amide fibers were cut to a length of 3 mm and dispersed in water, and a paper-like sheet having a base weight of 55 g/m² was formed by using a TAPPI type square paper machine. This paper-like sheet was inserted between two metal meshes and dried at 150° C. for 5 minutes in a hot-air drier. A varnish having a solid concentration of 60% was prepared as the epoxy resin composition by diluting an epoxy resin component comprising a brominated epibis type epoxy resin and an o-cresol-novolak type epoxy resin, a curing agent composed of dicyandiamide and a curing promoter composed of 2-ethyl-4-methylimidazole with a 1/1 mixed solvent of methylethylketone/methylcellosolve. This varnish (epoxy resin composition) had the sodium and chlorine contents shown in Table 1. The varnish of Example 1 was spray-coated on the paper-like sheet from the surfaces of the meshes, and the paper-like sheet was dried at 100° C. for 2 minutes in a hot-air drier and cured at 170° C. for 30 minutes. The amount applied of the resin was about 5% by weight, and the paper-like sheet was heat-pressed under conditions of 300 kg/cm and 2 m/min by using a pair of metal roll/elastic roll calenders comprising a metal roll having a surface temperature of 190° C.

Each of the above-mentioned woven fabrics (Comparative Examples 1 and 2) and the above-mentioned paper-like sheets (Examples 1 through 6 and Comparative Examples 3 through 7) was impregnated with the above-mentioned epoxy resin and dried at 100° C. for 3 minutes to form a prepreg. Then, two JTC copper foils (1 oz) supplied by Nikko-Gould Wheel and four prepregs prepared as described above were laminated, and the laminate was pressed under conditions of 170° C. and 50 kg/cm² for 1 hour by using a hot press. The obtained copper clad laminate was etched, washed with pure water and dried with hot air at 80° C. for 1 hour. In the obtained substrate, the volume ratio of the epoxy resin composition (solids) was about 60% and the thickness was 0.4 mm.

A silver paste (No. 4929 supplied by Du Pont) was coated on the substrate by the screen printing method to form silver electrodes, the distance therebetween being 0.5 mm. The insulation resistance between the silver electrodes was measured at a temperature of 20° C. and a relative humidity of 65% while applying a direct current voltage of 500V. In each sample, the value was larger than $1.0 \times 10^{15}$. The circuit substrate was subjected to the solder reflowing at 220° C. for 2 minutes, and the pressure cooker test was carried out at 121° C. under 2 kg/cm² for 200 hours while applying a voltage of 90V between the electrodes.

After the pressure cooker test, the insulation resistance between the electrodes was similarly measured at a temperature of 20° C. and a relative humidity of 65%, and the surface was observed to examine the state of the migration of silver.

The obtained data is shown in Table 2.

TABLE 2

| Form of Base Material | Kind of Fiber | Impurities in Base Material | Impurities in Epoxy Resin Composition | Example 1 | Example 2 | Example 3 | Example 4 | Example 5 | Example 6 |
| --- | --- | --- | --- | --- | --- | --- | --- | --- | --- |
| Paper | Wholly aromatic polyether-amide fiber | Equilibrium moisture content (% by weight) |  | 1.8 |  | 2.8 | 1.8 | 1.8 | 2.7 |
|  |  | Extracted sodium content (ppm) |  | 58 |  | 52 | 68 | 53 | 67 |
|  |  | Extracted chlor- |  | 31 | 30 | 32 | 46 | 45 |  |

TABLE 2-continued

| Woven fabric | Wholly aromatic polyether- amide fiber | ine content (ppm) Equilibrium moisture content (% by weight) Extracted sodium content (ppm) Extracted chlor- ine content (ppm) | | 1.8 58 31 | | | | |
|---|---|---|---|---|---|---|---|---|
| Woven Fabric | Poly-p- phenylene- terephthal- amide fiber | Equilibrium moisture content (% by weight) Extracted sodium content (ppm) Extracted chlor- ine content (ppm) | | | | | | |
| | | | Sodium content (ppm) | 2 | 2 | 2 | 2 | 2 | 5 |
| | | | Chlorine content (ppm) | 327 | 327 | 327 | 327 | 327 | 580 |
| Perfor- mances of substrate | Insulation resistance (Ω) between electrodes Degree of migration of silver (observation by optical microscope) Judgement | | | $7.9 \times 10^{15}$ no o | $8.3 \times 10^{15}$ no o | $2.4 \times 10^{14}$ no o | $1.9 \times 10^{14}$ no o | $2.3 \times 10^{14}$ no o | $1.5 \times 10^{14}$ no o |

| Form of Base Material | Kind of Fiber | Impurities in Base Material | Impurities in Epoxy Resin Composition | Compar- ative Ex- ample 1 | Compar- ative Ex- ample 2 | Compar- ative Ex- ample 3 | Compar- ative Ex- ample 4 | Compar- ative Ex- ample 5 | Compar- ative Ex- ample 6 | Compar- ative Ex- ample 7 |
|---|---|---|---|---|---|---|---|---|---|---|
| Paper | Wholly aromatic polyether- amide fiber | Equilibrium moisture content (% by weight) Extracted sodium content (ppm) Extracted chlor- ine content (ppm) | | | 4.1 58 29 | 1.8 95 31 | 1.8 54 68 | 1.8 52 22 | 4.2 90 74 | |
| Woven fabric | Wholly aromatic polyether- amide fiber | Equilibrium moisture content (% by weight) Extracted sodium content (ppm) Extracted chlor- ine content (ppm) | | | | | | | | |
| Woven Fabric | Poly-p- phenylene- terephthal- amide fiber | Equilibrium moisture content (% by weight) Extracted sodium content (ppm) Extracted chlor- ine content (ppm) | | 4.1 110 25 | 4.1 110 25 | | | | | |
| | | | Sodium content (ppm) | 2 | 10 | 2 | 2 | 2 | 10 | 10 |
| | | | Chlorine content (ppm) | 327 | 2300 | 327 | 327 | 327 | 2300 | 2300 |
| Perfor- mances of substrate | Insulation resistance (Ω) between electrodes Degree of migration of silver (observation by optical microscope) Judgement | | | $9.5 \times 10^{8}$ large xx | $1.2 \times 10^{8}$ large xx | $1.3 \times 10^{11}$ small x | $2.1 \times 10^{11}$ small x | $2.4 \times 10^{11}$ small x | $7.3 \times 10^{10}$ medium x | $8.4 \times 10^{9}$ large xx |

From the foregoing results, it was found that only where the substrate composed of the wholly aromatic polyether-amide fiber has an equilibrium moisture content lower than 3.0% by weight and has an extracted sodium content lower than 80 ppm and an extracted chlorine content lower than 50 ppm after 20 hours' boiling in pure water and the epoxy resin composition has a sodium content lower than 5 ppm and a chlorine content lower 600 ppm, in the substrate formed from the obtained prepreg, the migration of silver does not occur and little reduction of the insulation resistance between the silver electrodes is observed. It was also found that, when a poly-p-phenylene-terephthalamide is used as the base material, in the substrate prepared from the obtained prepreg the migration of silver is large and the reduction of the insulation resistance between the silver electrodes is large.

Figure 2:
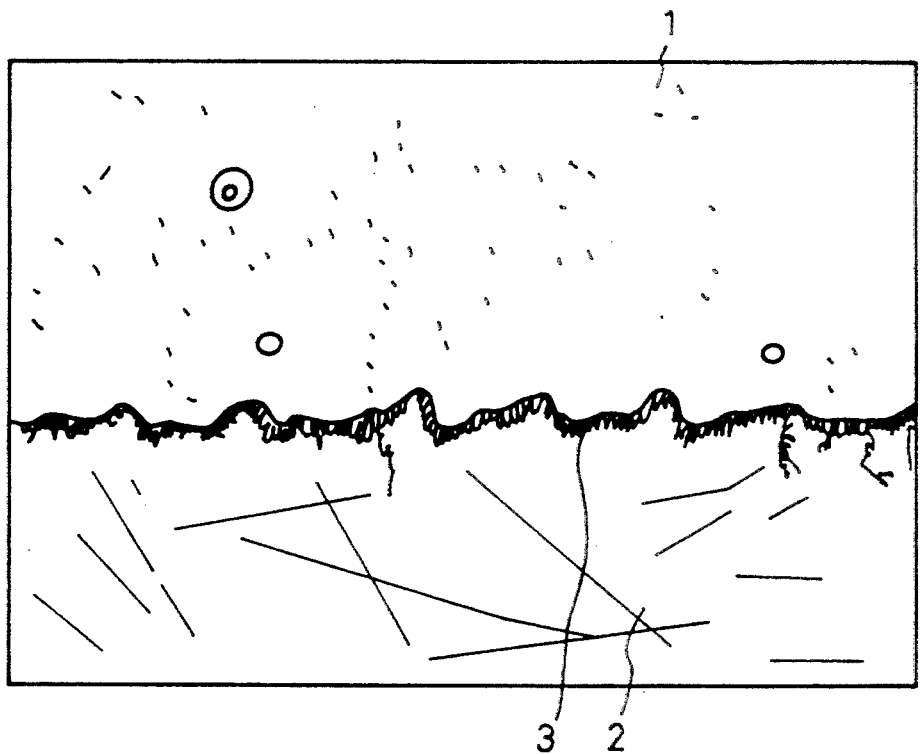
FIGS. 2, 3 and 4 are respectively, a diagrams illustrating the migration of silver on the surfaces of PWB's prepared by using conventional prepregs.
Figure 3:
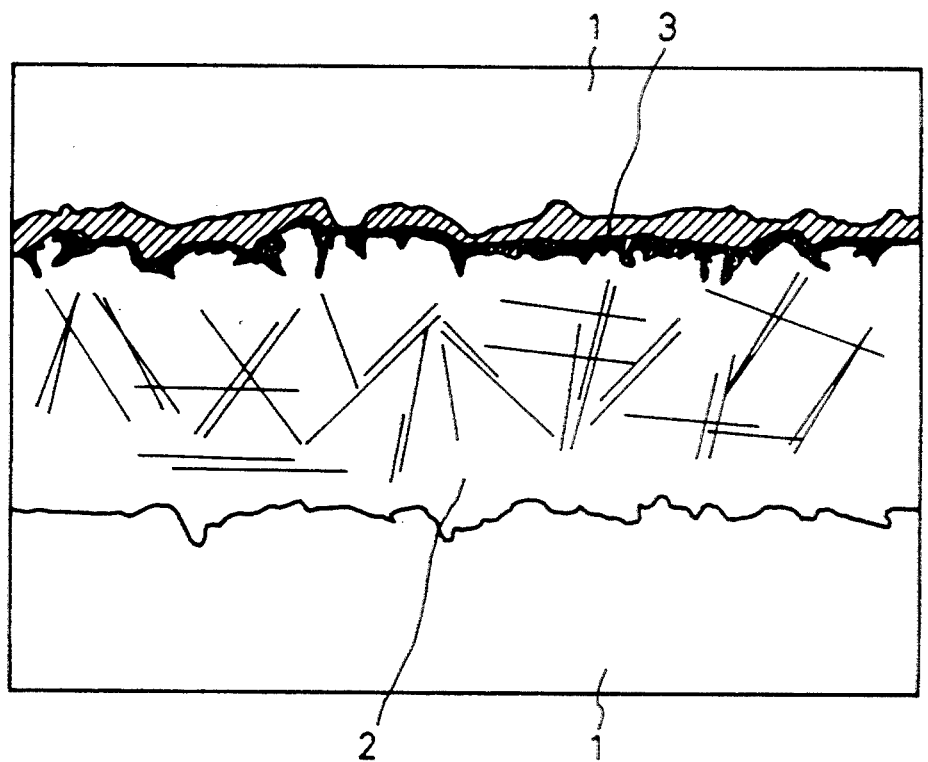
Figure 4:
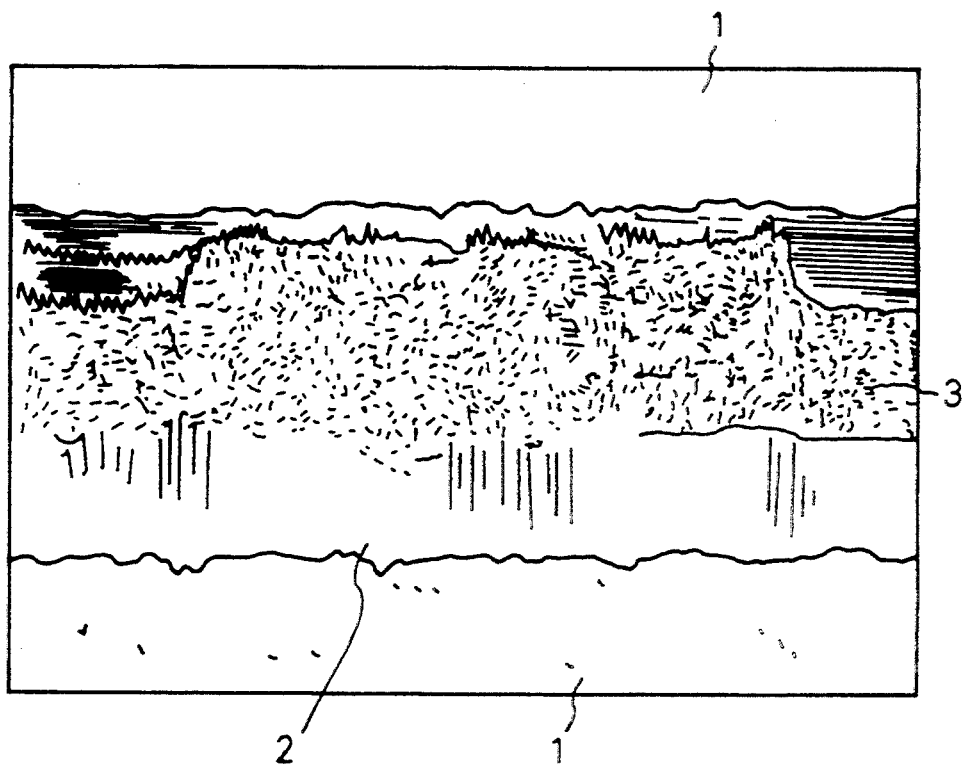

FIG. 1 is a diagram illustrating the state of the migration of silver in the substrate contained by using the prepreg of Example 1, and FIGS. 2, 3 and 4 are diagrams illustrating the states of the migration of silver in the substrates obtained from the prepregs of Comparative Examples 3, 6 and 1, respectively. In FIG. 1, the migration of silver is not observed between the silver electrode 1 of the substrate and the surface 2 of the substrate formed of the copper clad laminate. In contrast, in FIG. 2, 3 and 4, a silver layer 3 is formed by the migration of silver between the silver electrode 1 and the surface of the substrate.

EXAMPLE 7

A wholly aromatic polyether-amide (poly-p-phenylene-3,4'-diaminodiphenylether-terephthalamide) was prepared by copolymerizing 100 molar parts of high-purity terephthalic acid chloride, 50 molar parts of p-phenylene diamine and 50 molar parts of 3,4'- diaminodiphenylether, and the copolymer was wet-spun to obtain a fiber having equilibrium moisture content, extracted sodium content and extracted chlorine content shown in Table 2 and having a single filament fineness of 1.5 denier. The wholly aromatic polyetheramide fiber was cut into a length of 3 mm and dispersed in water to form a staple slurry. A paper-like sheet having a base weight of 55 g/m$^2$ was prepared from this slurry by using a TAPPI type square paper machine. The paper-like sheet was inserted between two metal meshes and dried at 150° C. for 5 minutes in a hot-air drier. An aqueous dispersion type epoxy resin composition having a sodium content of 1 ppm and a chlorine content of 150 ppm was spray-coated on the paper-like sheet from the surfaces of the metal meshes and the paper-like sheet was dried and cured at 100° C. for 2 minutes and at 160° C. for 30 minutes in a hot-air drier. The amount of the resin applied to the paper-like sheet was about 5% by weight. The paper-like sheet was heat-pressed under conditions of 300 kg/cm and 2 m/min by using metal roll/elastic roll calenders comprising a metal roll having a surface temperature of 190° C.

Separately, 80 parts by weight of a glycidyl ether compound (epoxy equivalent=208) composed of a reaction product of epichlorohydrin with a polycondensation product between bisphenol A and formaldehyde was reacted with 20 parts by weight of a bisphenol A epoxy resin (epoxy equivalent=187) and 30 parts by weight of tetrabromobisphenol A in the presence of 0.03 part by weight of dimethyl-imidazole to prepare an epoxy resin a-1 having an epoxy equivalent of 342 and a bromine content of 23% by weight.

Then, a curing agent b-1 composed of a polycondensation product between bisphenol A and formaldehyde was prepared.

Then, 56 parts by weight of the above-mentioned epoxy resin a-1 was mixed with 20 parts by weight of a brominated bisphenol A type epoxy (epoxy equivalent=470, bromine content=48% by weight) and 24 parts by weight of the above-mentioned curing agent, and 0.04 part by weight of 2-ethyl-4-methylimidazole was added to the mixture to prepare an epoxy resin composition. Then, a mixed solvent of methylethylketone and ethylene glycol monomethyl ether (mixing weight ratio=1/1) was added to the composition to obtain a varnish having a non-volatile content of 60% by weight and a bromine content of 22.5% by weight (based on the solids).

The above-mentioned paper-like sheet was impregnated with the so-prepared varnish and dried at 100° C. for 3 minutes to prepare a prepreg in which the content of the solids of the epoxy resin composition was 70% by weight. Then, two of copper foils [CF-T9 (1 oz) supplied by Fukuda Kinzoku Hakufun Kogyo] were laminated on four of prepregs prepared in the above-mentioned manner, and the laminate was pressed at 170° C. under 40 kg/cm$^2$ for 1 hour by a hot press to prepare a copper clad laminate. The volume ratio of the epoxy resin composition in the obtained copper foil-laminated, was about 60% and the thickness of the copper clad laminate, was 0.4 mm.

The base material in the copper clad laminate, the impurity contents in the resins and the characteristics are shown in Table 3.

EXAMPLE 8

The procedures of Example 7 were repeated in the same manner except that a plain weave fabric (having a base weight of 62 g/m$^2$ and a thickness of 0.1 mm) was formed by using the wholly aromatic polyamide fiber, impregnated with the varnish described in Example 1 and dried at 100° C. for 3 minutes. The content of the solids of the epoxy resin composition in the obtained prepreg was 70% by weight.

The test results are shown in Table 3.

EXAMPLE 9

The procedures of Example 7 were repeated in the same manner except that 0.5 part by weight of antimony pentoxide was further added to the varnish described in Example 7 to form a varnish having a non-volatile content of 60% by weight, and the paper-like sheet of the wholly aromatic polyamide fiber described in Example 1 was impregnated with this varnish.

The test results are shown in Table 3.

EXAMPLE 10

The procedures of Example 7 were repeated in the same manner except that the varnish was prepared in the following manner. Namely, 75 parts by weight of the epoxy resin a-1 was mixed with 25 parts by weight of the curing agent b-1, and 0.04 part by weight of 2-ethyl-4-imidazole and 6.0 parts by weight of antimony pentoxide were added to the mixture to prepare an epoxy resin composition. Then, a mixed solvent of methylethylketone and ethylene glycol monomethyl ether (mixing weight ratio =1/1) was added to the epoxy resin composition. The non-volatile content in the obtained varnish was 60% by weight and the bromine content was 17.3% by weight (based on the solids). The paper-like sheet of the wholly aromatic polyether amide fiber described in Example 7 was impregnated with the so-prepared varnish.

The test results are shown in Table 3.

EXAMPLE 11

The procedures of Example 7 were repeated in the same manner except that an epoxy resin a-2 prepared in the following manner was used instead of the epoxy resin a-1.

Preparation of Epoxy Resin a-2

In the same manner as described in Example 1, 80 parts by weight of a glycidyl ether compound (epoxy equivalent=470) composed of a reaction product of epichlorohydrin with a polycondensation product between brominated bisphenol A and formaldehyde was reacted with 20 part by weight of a bisphenol A type epoxy resin and 30 parts by weight of tetrabromobisphenol A. The obtained epoxy resin a-2 had an epoxy equivalent of 420 and a bromine content of 28% by weight.

Then, 79 parts by weight of the epoxy resin a-2 was mixed with the curing agent b-1, and 0.04 part by weight of 2-ethyl-4-methylimidazole and a mixed solvent of methylethylketone and ethylene glycol monomethyl ether (mixing weight ratio=1/1) were added to the mixture to form a varnish having a non-volatile content of 60% by weight and a bromine content of 22.1% by weight (based on the solids).

The paper-like sheet of the wholly aromatic polyether-amide fiber described in Example 7 was impregnated with the so-prepared varnish.

The test results are shown in Table 3.

EXAMPLE 12

A wholly aromatic polyether-amide (poly-p-phenylene-3,4'-diaminodiphenylether terephthalamide) was prepared by copolymerizing 100 molar parts of terephthalic acid chloride having a purity lower than that of terephthalic acid chloride used in Example 7 with 50 molar parts of p-phenylenediamine and 50 molar parts of 3,4'-diamino-diphenyl ether. The copolymer was wet-spun to form a fiber having equilibrium moisture content, extracted sodium content and extracted chlorine content shown in Table 2 and a single filament fineness of 1.5 denier. A paper-like sheet was prepared from the so-obtained wholly aromatic polyamide fiber.

The paper-like sheet was impregnated with a varnish having impurity contents shown in Table 3 and dried at 100° C. for 3 minutes to form a prepreg. The content of the epoxy resin composition in the prepreg was 70% by weight.

The test results are shown in Table 3.

COMPARATIVE EXAMPLE 8

The procedures of Example 7 were repeated in the same manner except that a woven fabric of poly-p-phenylene-terephthalamide (Kevlar 49 R woven fabric K-120, single filament finess of 1.42 denier, supplied by Kanebo) was used as the base material. The base weight of the woven fabric was 60 g/m² and the thickness was about 0.1 mm.

The test results are shown in Table 3.

COMPARATIVE EXAMPLE 9

The procedures of Example 7 were repeated in the same manner except that a varnish prepared in the following manner.

Preparation of Varnish

A high-purity varnish was prepared from 82 parts by weight of a brominated bisphenol A type epoxy resin (having an epoxy equivalent of 460 and a bromine content of 21% by weight), 14 parts by weight of a brominated phenol-novolak type epoxy resin (having an epoxy content of 275 and a bromine content of 36% by weight), 4 parts by weight of dicyandiamide, 0.04 part by weight of 2-ethyl-4-methylimidazole and a mixed solvent of methylethylketone and ethylene glycol monomethyl ether (mixing weight ratio=1/1). The non-volatile content in the varnish was 60% by weight and the bromine content was 2.3% by weight (based on the solids).

The woven fabric composed of poly-p-phenylene terephthalamide described in Comparative Example 8 was impregnated with the so-obtained varnish.

The test results are shown in Table 3.

COMPARATIVE EXAMPLE 10

The procedures of Example 7 were repeated in the same manner except that the paper-like sheet of the wholly aromatic polyether-amide fiber described in Example 7 was impregnated with the varnish described in comparative Example 9.

The test results are shown in Table 3.

COMPARATIVE EXAMPLE 11

The procedures of Example 7 were repeated in the same manner except that a wholly aromatic polyetheramide (poly-p-phenylene-3,4'-diaminodiphenylether terephthalamide) was prepared by copolymerizing 100 molar parts of terephthalic acid chloride having a purity lower than that of terephthalic acid chloride described in Example 12 with 50 molar parts of p-phenylene-diamine and 50 molar parts of 3,4'-diaminodiphenylether and the copolymer was wet-spun to prepare a fiber having equilibrium moisture content, extracted sodium content and extracted chlorine content shown in Table 3 and a single filament fineness of 1.5 denier. A paper-like sheet was prepared from this wholly aromatic polyether-amide fiber in the same manner as described in Example 7.

The so-obtained paper-like sheet was impregnated with the varnish described in Example 7 and dried at 100° C. for 3 minutes to form a prepreg. The content of the epoxy resin composition in the prepreg was 70% by weight.

The test results are shown in Table 3.

COMPARATIVE EXAMPLE 12

The procedures of Example 7 were repeated in the same manner except that the paper-like sheet of the wholly aromatic polyether-amide fiber described in Example 7 was impregnated with a varnish having the same composition as that of the varnish described in Example 12 and having impurity contents shown in Table 2.

The test results are shown in Table 3.

COMPARATIVE EXAMPLE 13

The procedures of Example 7 were repeated in the same manner except that the paper-like sheet of the wholly aromatic polyether-amide fiber described in Comparative Example 11 was impregnated with the varnish described in Comparative Example 9.

The test results are shown in Table 3.

COMPARATIVE EXAMPLE 14

The procedures of Example 7 were repeated in the same manner except that the varnish was prepared in the following manner.

Preparation of Varnish

A varnish was prepared from 28 parts by weight of a brominated bisphenol A type epoxy resin as described in Comparative Example 9, 43 parts by weight of a brominated phenol-novolak type epoxy resin, 29 parts by weight of o-cresol-novolak type epoxy resin as described in Comparative Example 9, 0.04 part by weight of 2-ethyl-4-methylimidazole and a mixed solvent comprising methyl-ethylketone and ethylene glycol monomethyl ether (mixing weight ratio=1/1). The non-volatile content in the varnish was 60% by weight and the bromine content was 21.4% by weight (based on the solids).

The paper-like sheet of the wholly aromatic polyetheramide fiber described in example 7 was impregnated with the so-prepared varnish.

The test results are shown in Table 3.

COMPARATIVE EXAMPLE 15

The procedures of Example 7 were repeated in the same manner except that a varnish prepared in the following manner was used.

Preparation of Varnish

A varnish was prepared from 20 parts by weight of the brominated bisphenol A type epoxy resin described in Comparative Example 14, 57 parts by weight of an epoxy resin, which was a glycidyl ether compound composed of a reaction product of epichlorohydrin with a polycondensation product between brominated phenol A and formaldehyde, 23 parts by weight of the curing agent b-1, 0.04 part by weight of 2-ethyl-4-methylimidazole and a mixed solvent comprising methylethylketone and ethylene glycol monomethyl ether (mixing weight ratio=1/1). The non-volatile content of the varnish was 60% by weight and the bromine content was 24.2% by weight (based on the solids).

The paper-like sheet of the wholly aromatic polyetheramide fiber described in Example 7 was impregnated with the so-prepared varnish.

The test results are shown in Table 3.

TABLE 3

| Form of Base Material | Kind of Fiber | Impurities Contents in Base Material | Example 7 | Example 8 | Example 9 | Example 10 | Example 11 | Example 12 | Comparative Example 8 |
|---|---|---|---|---|---|---|---|---|---|
| Paper | Wholly aromatic polyetheramide fiber | Equilibrium moisture content (% by weight) | 1.8 | | 1.8 | 1.8 | 1.8 | 2.7 | |
| | | Extracted sodium content (ppm) | 58 | | 58 | 58 | 58 | 67 | |
| | | Extracted chlorine content (ppm) | 31 | | 31 | 31 | 31 | 45 | |
| Woven fabric | Wholly aromatic polyetheramide fiber | Equilibrium moisture content (% by weight) | | 1.8 | | | | | |
| | | Extracted sodium content (ppm) | | 58 | | | | | |
| | | Extracted chlorine content (ppm) | | 31 | | | | | |
| Woven Fabric | Poly-p-phenyleneterephthalamide fiber | Equilibrium moisture content (% by weight) | | | | | | | 4.1 |
| | | Extracted sodium content (ppm) | | | | | | | 110 |
| | | Extracted chlorine content (ppm) | | | | | | | 25 |
| Epoxy Resin Composition | Epoxy resin a-1 | Reaction product of glycidyl ether compound prepared from bisphenol A, formaldehyde and epichlorohydrin, bisphenol A type glycidyl compound and tetrabromobisphenol A | 56 | 56 | 56 | 75 | | 56 | 56 |
| | Epoxy resin a-2 | Reaction product of glycidyl ether compound prepared from brominated bisphenol A, formaldehyde and epichlorohydrin and tetrabromobisphenol A | | | | | 79 | | |
| | | Brominated bisphenol A type epoxy resin (Br content-21% by weight) | | | | | | | |
| | | Brominated bisphenol A type epoxy resin (Br content-48% by weight) | 20 | 20 | 20 | | | 20 | 20 |
| Epoxy resin | | Glycidyl ether compound prepared from brominated bisphenol A, formaldehyde and epichlorohydrin | | | | | | | |
| | | Brominated phenol-novolak resin | | | | | | | |
| Curing agent | Curing agent b-1 | Bisphenol A/formaldehyde polycondensate | 24 | 24 | 24 | 25 | 21 | 24 | 24 |
| | | o-cresol-novolak resin | | | | | | | |
| | | Dicyandiamide | | | | | | | |
| | | 2-ethyl-4-methylimidazole | 0.04 | 0.04 | 0.04 | 0.04 | 0.04 | 0.04 | 0.04 |
| | | Antimony pentoxide | | | | 0.5 | 6.0 | | |
| Impurities | | Sodium content (ppm) | 2 | 2 | 2 | 3 | 2 | 5 | 2 |
| | | Chlorine content (ppm) | 327 | 327 | 332 | 341 | 415 | 580 | 327 |
| Performance of substrate | | Glass transition point: Tg (°C.) | 168 | 167 | 165 | 175 | 162 | 167 | 165 |
| | | Peel strength: PS (kg/cm) | 1.6 | 1.6 | 1.6 | 1.5 | 1.6 | 1.6 | 1.6 |
| | | Insulation resistance ($\Omega$) between silver electrodes | $7.9 \times 10^{15}$ | $8.3 \times 10^{15}$ | $5.6 \times 10^{15}$ | $4.1 \times 10^{15}$ | $7.3 \times 10^{15}$ | $1.5 \times 10^{14}$ | $1.9 \times 10^{7}$ |
| | | Degree of migration of silver (observation by optical microscope observation) | no | no | no | no | no | large | large |
| | | Judgement | o | o | o | o | o | o | x |

| Form of Base Material | Kind of Fiber | Impurities Contents in Base Material | Comparative Example 9 | Comparative Example 10 | Comparative Example 11 | Comparative Example 12 | Comparative Example 13 | Comparative Example 14 | Comparative Example 15 |
|---|---|---|---|---|---|---|---|---|---|
| Paper | Wholly | Equilibrium moisture | | 1.8 | 4.2 | 1.8 | 4.2 | 1.8 | 1.8 |

TABLE 3-continued

| | | | | | | | | | |
|---|---|---|---|---|---|---|---|---|---|
| | aromatic polyether-amide fiber | content (% by weight) Extracted sodium content (ppm) Extracted chlorine content (ppm) | | 58 31 | 90 74 | 58 31 | 90 74 | 58 31 | 58 31 |
| Woven fabric | Wholly aromatic polyether-amide fiber | Equilibrium moisture content (% by weight) Extracted sodium content (ppm) Extracted chlorine content (ppm) | | | | | | | |
| Woven Fabric | Poly-p-phenylene-terephthal-amide fiber | Equilibrium moisture content (% by weight) Extracted sodium content (ppm) Extracted chlorine content (ppm) | 4.1 110 25 | | | | | | |
| Epoxy Resin Composition | Epoxy resin | Epoxy resin a-1 | Reaction product of glycidyl ether compound prepared from bisphenol A, formaldehyde and epichloro-hydrin, bisphenol A type glycidyl compound and tetrabromobisphenol A | | 56 | 56 | | | |
| | | Epoxy resin a-2 | Reaction product of glycidyl ether compound prepared from brominated bisphenol A, formaldehyde and epichloro-hydrin and tetrabromo-bisphenol A | | | | | | |
| | | Brominated bisphenol A type epoxy resin (Br content-21% by weight) | | 82 | 82 | | | 82 | 28 | 20 |
| | | Brominated bisphenol A type epoxy resin (Br content-48% by weight) | | | | 20 | 20 | | | |
| | Epoxy resin | Glycidyl ether compound prepared from brominated bisphenol A, formaldehyde and epichlorohydrin | | | | | | | | 57 |
| | | Brominated phenol-novolak resin | | 14 | 14 | | | 14 | 43 | |
| Curing agent | Curing agent b-1 | Bisphenol A/formaldehyde polycondensate | | | | 24 | 24 | | | 23 |
| | o-cresol-novolak resin | | | | | | | | 29 | |
| | Dicyandiamide | | | 4 | 4 | | | 4 | | |
| | 2-ethyl-4-methylimidazole | | | 0.04 | 0.04 | 0.04 | 0.04 | 0.04 | 0.04 | 0.04 |
| | Antimony pentoxide | | | | | | | | | |
| Impurities | Sodium content (ppm) | | | 0 | 0 | 2 | 10 | 0 | 1 | 2 |
| | Chlorine content (ppm) | | | 306 | 306 | 327 | 2300 | 306 | 311 | 298 |
| Performance of substrate | Glass transition point: Tg (°C.) | | | 118 | 119 | 169 | 168 | 117 | 152 | 137 |
| | Peel strength: PS (kg/cm) | | | 2.1 | 2.1 | 1.6 | 1.6 | 2.1 | 0.1 | 1.4 |
| | Insulation resistance ($\Omega$) between silver electrodes | | | $4.5 \times 10^7$ | $5.6 \times 10^9$ | $2.8 \times 10^{12}$ | $3.0 \times 10^7$ | $7.4 \times 10^8$ | $1.9 \times 10^{15}$ | $1.7 \times 10^{15}$ |
| | Degree of migration of silver (observation by optical microscope observation) | | | large | medium | small | large | large | no | no |
| | Judgement | | | x | x | x | x | x | x | x |

As is apparent from the results shown in Table 3, only where the aromatic polyamide fiber of a prepreg-copper clad laminate comprising a wholly aromatic polyether-amide fiber as the base material has an equilibrium moisture content lower than 3.0% by weight at a temperature of 20° C. and a relative humidity of 65%, an extracted sodium content lower than 80 ppm after 20 hours' boiling in pure water and an extracted chlorine content lower than 50 ppm after 20 hours' boiling in pure water and the epoxy resin composition has a sodium content lower than 5 ppm and a chlorine content lower than 600 ppm, did the obtained copper clad laminate and COB have an excellent heat resistance and peel strength, the migration of silver did not occur and no substantial reduction of the insulation resistance between silver electrodes was observed.

In contrast, when the poly-p-phenylene terephthal-amide fiber or the wholly aromatic polyether-amide fiber having a low purity is used as the base material or the base material is impregnated with the epoxy resin composition containing dicyandiamide as the curing agent, which has a low heat resistance, the migration of silver occurs in the obtained PWB and the reduction of the insulation resistance between silver electrodes is large. Furthermore, when the base material is impregnated with an epoxy resin composition different from the specific epoxy resin composition of the present invention, the heat resistance or peel strength of the obtained copper clad laminate is low and the performances of the substrate are unsatisfactory.

Figure 5:
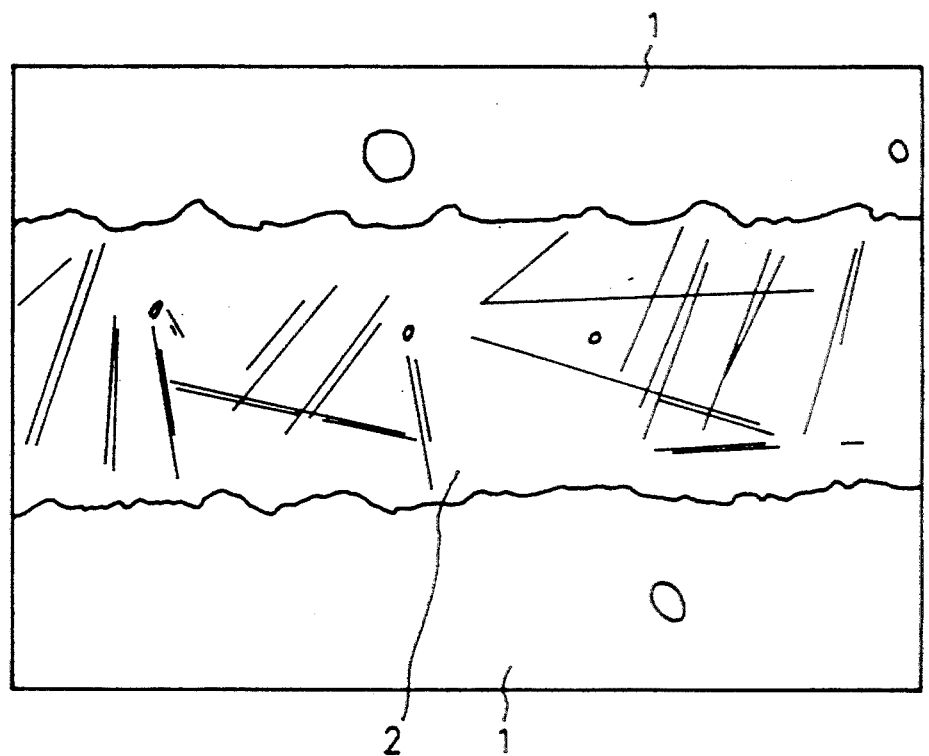
FIGS. 5 and 6 are respectively diagrams illustrating the migration of silver on the surfaces of PWB's prepared by using the prepregs of the present invention.

FIG. 5 is a diagram illustrating the state of the migration of silver in the substrate obtained by using the prepreg of Example 7.

Figure 6:
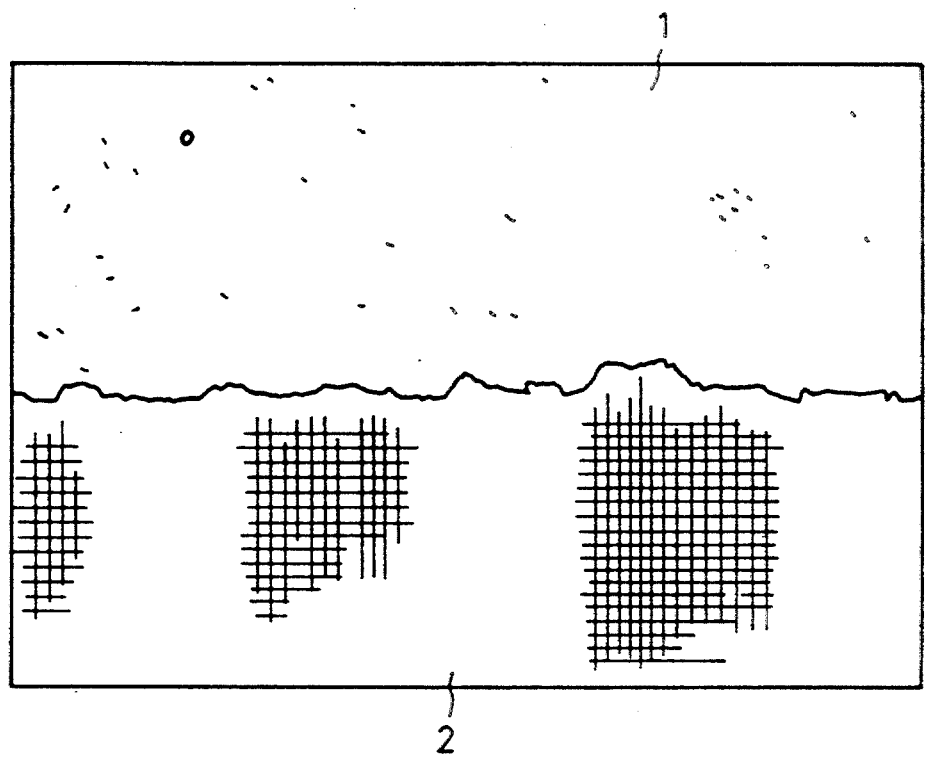

FIG. 6 is a diagram illustrating the state of the migration of silver in the substrate prepared by using the prepreg of Example 8.

Figure 7:
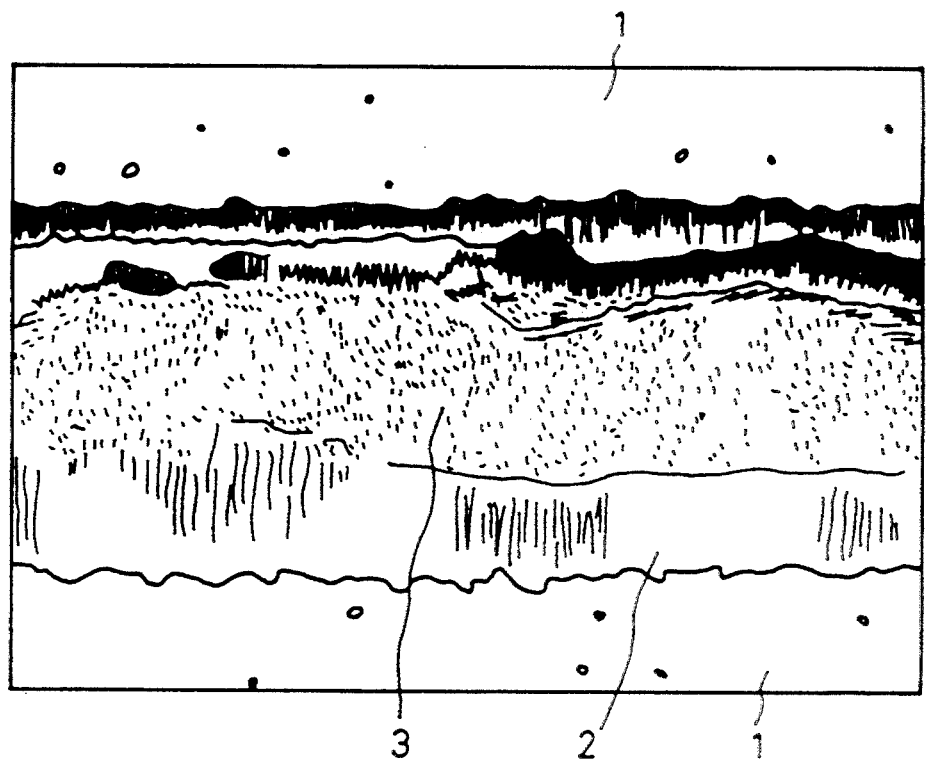
FIGS. 7 and 8 are respectively diagrams illustrating the migration of silver on the surfaces of PWP's prepared by using conventional prepregs.

FIG. 7 is a diagram illustrating the state of the migration of silver in the substrate prepared by using the prepreg of Comparative Example 8.

Figure 8:
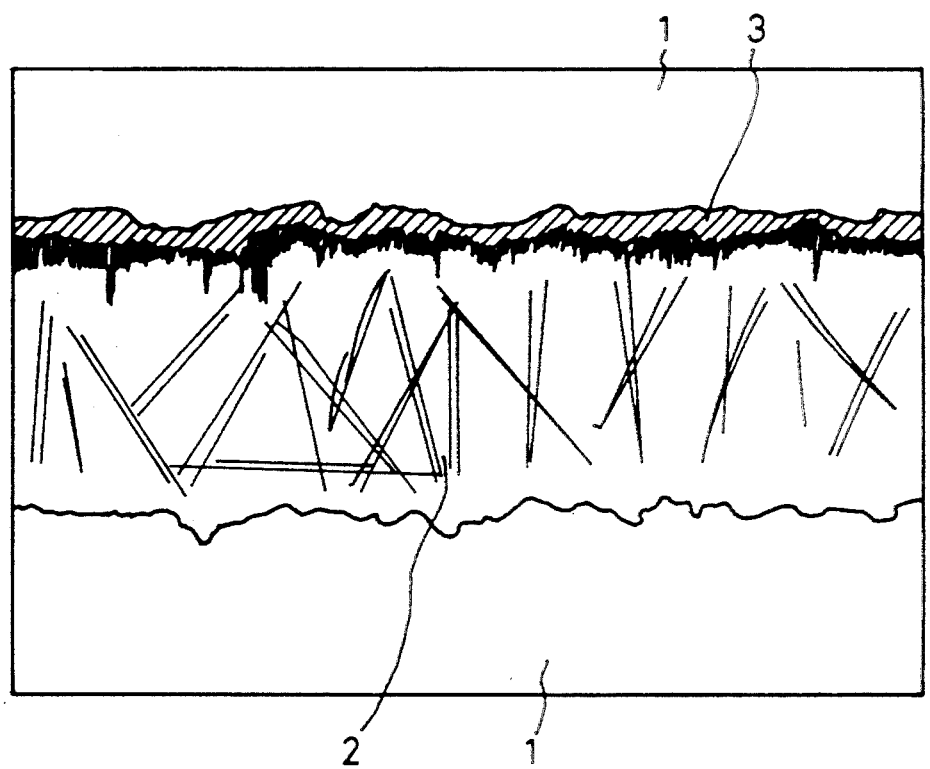

FIG. 8 is a diagram illustrating the state of the migration of silver in the substrate prepared by using the prepreg of Comparative Example 11.

In FIGS. 5 and 6, the migration of silver is not observed between the silver electrode 1 of COB and the surface 2 of the substrate composed of the copper clad laminate.

But a silver layer 3 is formed by the migration of silver between the silver electrode 1 and the surface 2 of the substrate composed of the copper clad laminate in FIGS. 7 and 8.

INDUSTRIAL APPLICABILITY

Since the epoxy resin-impregnated prepreg of the present invention comprises an aromatic polyamide fiber as the base material, the temperature linear expansion coefficient in the plane direction is as small as that of a silicon-bearing chip. Accordingly, in the copper clad laminate prepared by using this prepreg, cracking is not caused in a die-bonded portion or the like. Moreover, since the prepreg of the present invention has a high heat resistance, the copper clad laminate prepared by using this prepreg can resist a high temperature at the die bonding step or a high temperature at the wire or wireless bonding step.

More specifically, the copper clad laminate formed by using the epoxy resin-impregnated prepreg of the present invention has a glass transition point higher than 150° C. as measured by TMA and has an excellent heat resistance, and the peel strength of a 1-oz copper foil is higher than 1.4 kg/cm at normal temperature. Accordingly, the prepreg is useful for the production of a substrate for the chip-on-board technology practically excellent for the production of a high-density circuit.

Furthermore, the prepreg of the present invention has low equilibrium moisture content, sodium content and chlorine content in the aromatic polyamide fiber as the base material, and the sodium content and chlorine content of the epoxy resin composition are low. Accordingly, PWB prepared by using this prepreg has a merit that the migration of silver is controlled even in an electric field under high-temperature and high-humidity conditions and the reduction of the insulation resistance is small.

We claim:

1. An epoxy resin composition-impregnated prepreg for a copper clad laminate of a chip-on-board comprising a base material comprising, as a main component, aromatic polyamide fibers; and a resin composition comprising an epoxy resin and a curing agent impregnated in the base material;

said aromatic polyamide fibers having been produced by a wet-spin-drawing process having a draw-washing procedure in which undrawn aromatic polyamide filaments are drawn at a draw ratio of from 1.05 to 1.5, while forwarding the filaments through a hot water bath having a path length of 1 to 50 m and while flowing hot water at a temperature of 30° C. to 100° C. through the bath in a direction counter to the forwarding direction of the filaments to squeeze out impurities from the filaments, and then drying the draw-washed filaments, said aromatic polyamide fiber base material having an equilibrium moisture content of up to 3.0% by weight, an extracted impurity sodium content of up to 80 ppm and an extracted impurity chlorine content of up to 50 ppm; and said epoxy resin composition having an impurity sodium content of up to 5 ppm and an impurity chlorine content of up to 600 ppm.

2. The prepreg as claimed in claim 1, wherein the undrawn aromatic polyamide filaments are obtained by directly wet-spinning a polymerization solution of an aromatic polyamide obtained by carrying out the polymerization in a non-protonic amide solvent without isolation of the resultant polymer.

3. The prepreg as set forth in claim 1, wherein the weight ratio of the base material to the resin composition is in the range of from 20:80 to 60:40.

4. The prepreg as set forth in claim 1, wherein the content of the curing agent in the resin composition is in the range of from 2% to 60% by weight based on the weight of epoxy resin.

5. The prepreg as set forth in claim 1, wherein the polymer from which the aromatic polyamide fibers are formed, comprises 75 to 100 molar % of at least one member selected from recurring units represented by the following general formulae (I) and (II):

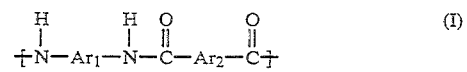

and

wherein $Ar_1$, $Ar_2$, and $Ar_3$ respectively and independently from each other represent a member from the group consisting of substituted and unsubstituted aromatic ring groups having the following ring structures:

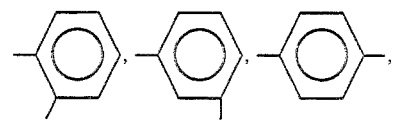

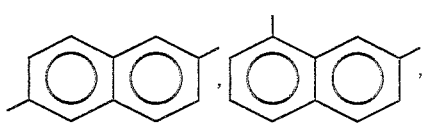

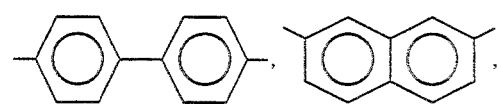

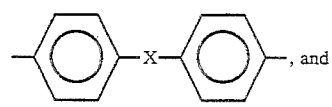

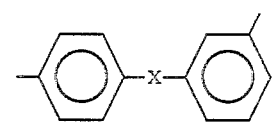

wherein X represents a member selected from —O—, —S—,

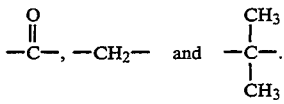

6. The prepreg as set forth in claim 5, wherein in the recurring units of the formula (I), 15 to 30% of the aromatic ring groups represented by Ar₁ have the ring structure of

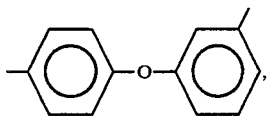

and the remaining ring groups have the ring structure of

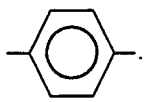

7. The prepreg as set forth in claim 5, wherein at least one member of the substituted aromatic ring groups having the ring structure of:

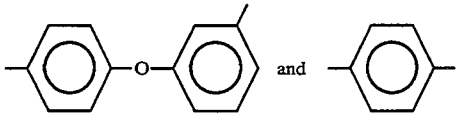

has at least one substituent selected from the group consisting of halogen atoms, a methyl group and a methoxy group.

8. The prepreg as set forth in claim 1, wherein the aromatic polyamide fibers are in the form of staple fibers, pulpy fibrils or a mixture thereof.

9. The prepreg as set forth in claim 1, wherein the aromatic polyamide fiber has an individual filament thickness of 0.1 to 10 denier.

10. The prepreg as set forth in claim 1, wherein the aromatic polyamide fiber base material is in the form of a woven fabric, a knitted fabric, a nonwoven fabric or a paper-like sheet.

11. The prepreg as set forth in claim 1, wherein the aromatic polyamide fibers are dispersed in the epoxy resin.

12. The prepreg as set forth in claim 1, wherein the aromatic polyamide fiber base material comprises 60% to 100% by weight of an aromatic polyamide fibers and 0 to 40% by weight of at least one other fibers.

13. The prepreg as set forth in claim 1, wherein the epoxy resin comprises at least one member selected from;

(A) diglycidyl ether compounds consisting of reaction products of at least one member selected from bisphenol. A and halogenated bisphenol A with epichlorohydrin, (B) polyglycidylether compounds consisting of reaction products of polyhydric alcohol compounds consisting of reaction products of bisphenol A with an alkylene oxide, with epichlorohydrin (C) a phenol-novolak epoxy compound, and (D) an o-cresol-novolak epoxy compound.

14. The prepreg as set forth in claim 1, wherein the curing agent comprises at least one member selected from dicyandiamide compounds, aromatic polyamine compounds and phenolic resins.

15. The prepreg as set forth in claim 1, wherein the epoxy resin in the epoxy resin composition comprises at least one member of the reaction products of (I) at least one member selected from the group consisting of glycidyl ether compounds consisting of reaction products of epichlorohydrin with polycondensation products of bisphenol A and formaldehyde, and halogenated glycidyl ether compounds consisting of reaction products of epichlorohydrin with polycondensation products of halogenated bisphenol A with formaldehyde, with (II) at least one member selected from bisphenol A and bisphenol F glycidyl ether compounds represented by the following formula:

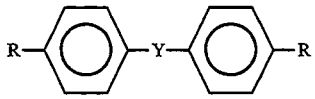

wherein Y represents a member selected from a —C(CH₃)₂— group and —CH₂— group, R represents an oligomeric residue of an epoxy compound, and each benzene nucleus may be substituted with a bromine atom, and (III) at least one member selected from bisphenol A, bisphenol F and tetrabromobisphenol A.

16. The prepreg as set forth in claim 1, wherein the curing agent in the epoxy resin composition comprises at least one member selected from polycondensation products of bisphenol A with formaldehyde and polycondensation products of halogenated bisphenol A with formaldehyde.

17. The prepreg as set forth in claim 1, wherein in the epoxy resin composition, the ratio of the phenolic hydroxyl group equivalent of the curing agent to the epoxy equivalent of the epoxy resin is in the range of from 0.6 to 1.3.

18. The prepreg as set forth in claim 1, wherein the epoxy resin comprises a reaction product of (i) 50 to 90 parts by weight of at least one glycidyl ether compound component consisting of a reaction product of epichlorohydrin with a polycondensation product of at least one member selected from bisphenol A and brominated bisphenol A with formaldehyde, with (ii) 5 to 50 parts by weight of at least one type of bisphenol A epoxy resin component and (iii) 10 to 50 parts by weight of a tetrabromobisphenol A component.

19. The prepreg as set forth in claim 1, wherein the epoxy resin composition comprises a brominated bisphenol A epoxy resin in an amount of 10 to 30% by weight bases on the total solid weight of the epoxy resin composition.

20. The prepreg as set forth in claim 18, wherein the brominated bisphenol A epoxy resin contains 45 to 55% by weight of bromine.

* * * * *